United States Patent [19]
Dakeyama

[11] Patent Number: 6,075,374
[45] Date of Patent: Jun. 13, 2000

[54] TEST HEAD OF AN IC TEST DEVICE

[75] Inventor: Mutsuo Dakeyama, Tokyo, Japan

[73] Assignee: Ando Electric Co., Ltd., Tokyo, Japan

[21] Appl. No.: 08/997,864

[22] Filed: Dec. 24, 1997

[30] Foreign Application Priority Data

Dec. 26, 1996 [JP] Japan ................................. 8-357282

[51] Int. Cl.$^7$ .............................................. G01R 31/02
[52] U.S. Cl. ........................................ 324/754; 324/763
[58] Field of Search ................................ 324/754, 73.1, 324/755, 765

[56] References Cited

U.S. PATENT DOCUMENTS 5,146,161 9/1992 Kiser ........................................ 324/763

*Primary Examiner*—Josie Ballato
*Assistant Examiner*—Minh Tang
*Attorney, Agent, or Firm*—Flynn, Thiel, Boutell & Tanis, P.C.

[57] ABSTRACT

A test head of an IC test device is provided for eliminating reflection of a high frequency test pattern signal to enhance measuring accuracy by relaying a measuring line extending from a driver.comparator circuit to a terminating resistor by way of a DUT without interposing a through hole. The test head of an IC test device comprises a first pin card, a second pin card and a DUT board, wherein a measuring line extending from the driver.comparator circuit mounted on the first pin card to the terminating resistor mounted on the second pin card by way of a DUT is relayed by a conductive pattern provided on the DUT board.

6 Claims, 3 Drawing Sheets

FIG. 2 (A) (PRIOR ART)
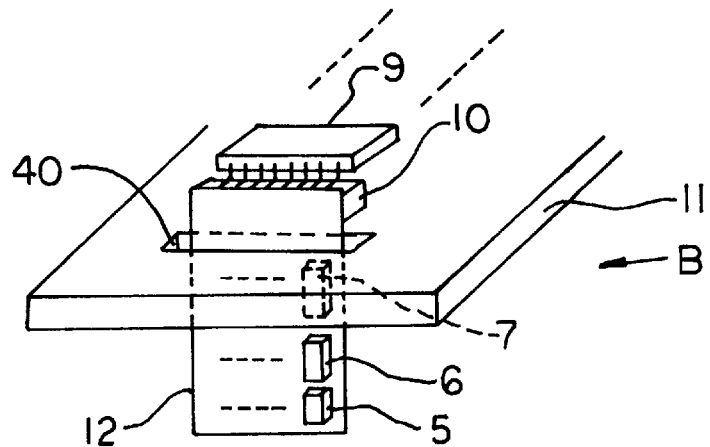
FIG. 2 (B) (PRIOR ART)
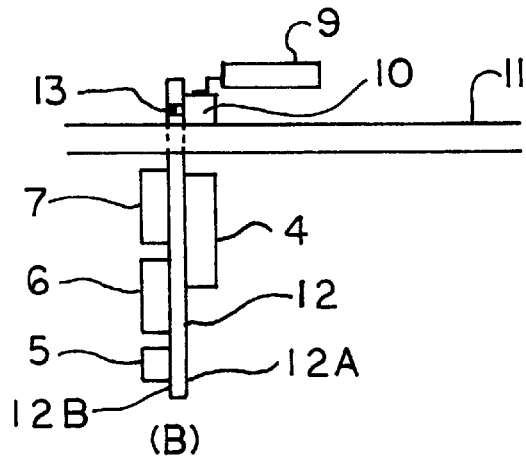
FIG. 2 (C) (PRIOR ART)
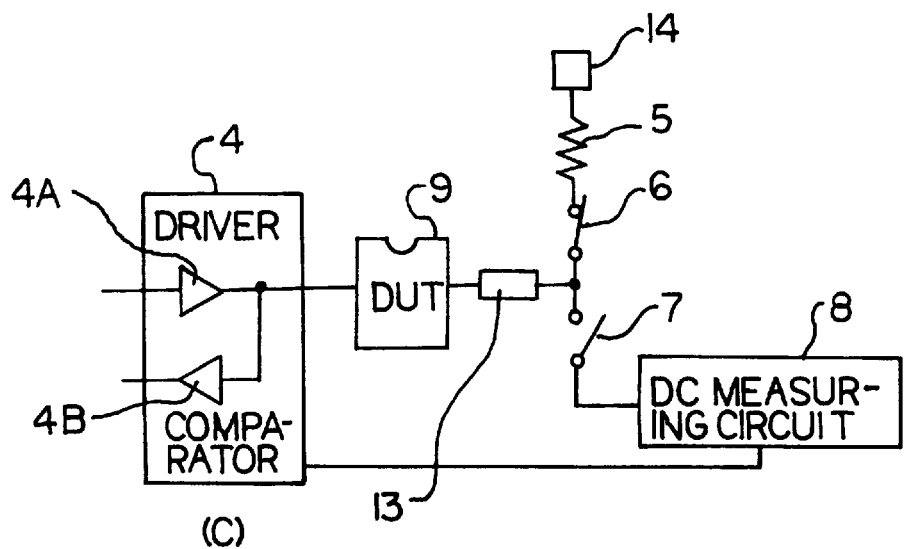

TEST HEAD OF AN IC TEST DEVICE

BACKGROUND OF THE INVENTION

1. Field of the Invention

The present invention relates to a test head of an IC test device, particularly to that for carrying out a high speed functional test of a device under test (hereinafter referred to as DUT) such as a memory and also a DC test.

2. Prior Art

An IC test device comprises generally, as shown in FIG. 3, a CPU 1, a pattern generator 2, a decision device 3, a driver.comparator circuit 4 composed of a driver 4A and a comparator 4B, a power supply 14, a terminating resistor 5, a terminating resistor intermittent relay 6, a DC measuring circuit intermittent relay 7, a DC measuring circuit 8 for carrying out a high speed functional test and a DC test of a DUT 9.

The CPU 1 is connected to the driver 4A of the driver-.comparator circuit 4 by way of the pattern generator 2, and it is also connected to the comparator 4B of the driver.comparator circuit 4 by way of the decision device 3.

The DUT 9 is connected to the terminating resistor 5 by way of the terminating resistor intermittent relay 6, and the terminating resistor 5 is connected to the power supply 14.

The DUT 9 is also connected to the DC measuring, circuit 8 by way of the DC measuring circuit intermittent relay 7, and the DC measuring circuit 8 is connected to the CPU 1. The IC test device having such a construction carries out the high speed functional test and the DC test of the DUT 9 in accordance with a test program which is inputted to the CPU 1.

First of all, when the high speed functional test is carried out, in FIG. 3, the terminating resistor intermittent relay 6 is turned on to terminate at the terminating resistor 5 having a resistance value $R_E$ which is substantially the same as characteristic impedance $Z_O$ of a signal line extending from the driver.comparator circuit 4 to the DUT 9, so that an impedance matching between the characteristic impedance $Z_O$ and the resistance value $R_E$ is performed while the DC measuring circuit intermittent relay 7 is turned off to be disconnected from the DC measuring circuit 8.

In this state, measuring frequency information which is set by the CPU 1 is supplied to the pattern generator 2, while the information concerning a driver level and a comparator level is supplied from the CPU 1 to the driver.comparator circuit 4, wherein a test pattern signal of the measuring frequency information is generated in the pattern generator 2. The test pattern signal is amplified to the extent of a driver level which is set by the driver 4A of the driver.comparator circuit 4, and the same signal is inputted to the DUT 9.

As a result, an output pattern signal from the DUT 9 is inputted to the comparator 4B of the driver.comparator circuit 4, and it is compared with a set comparator level, and the result of comparison is stored in the decision device 3, so that a yes-no decision of the high speed functional test of the DUT 9 is notified to the CPU 1.

In case that the DC test is carried out next, the terminating resistor intermittent relay 6 is turned off to disconnect the DUT 9 from the terminating resistor 5, thereby eliminating the influence by the terminating resistor 5 while the DC measuring circuit intermittent relay 7 is turned on to connect the DUT 9 to the DC measuring circuit 8.

When a voltage or a current is supplied to the DUT 9, the DC test is carried out by the DC measuring circuit 8, and the result, of the test is notified to the CPU 1.

In such an IC test device, the conventional test head has constructions set forth in FIG. 2(A) and FIG. 2(B).

That is, a pin card 12 is secured to the DUT board 11, and an IC circuit 10 and driver.comparator circuit 4 are respectively mounted on an inner side 12A of the pin card 12.

When the driver.comparator circuit 4 and the IC circuit 10 are connected to each other by a conductive pattern (not shown) provided on the inner side 12A of the pin card 12, the driver.comparator circuit 4 is connected to the DUT 9 by way of the IC circuit 10.

Meanwhile, the terminating resistor intermittent relay 6, the terminating resistor 5 and the DC measuring circuit intermittent relay 7 are respectively mounted on an outer side 12B of the pin card 12, and these elements are respectively connected to the IC circuit 10 mounted on the inner side 12A by a conductive pattern (not shown) provided on the outer side 12B and a through hole 13 (see FIG. 2(B)).

In other words, a measuring line extending from the driver.comparator circuit 4 mounted on the inner side 12A to the terminating resistor 5 mounted on the outer side 12B by way of the DUT 9 mounted on the IC circuit 10 is relayed by the through hole 13.

The pin card 12 which mounts the driver.comparator circuit 4, etc. on the inner side 12A and outer side 12B thereof is fixed to the DUT board 11 by way of an opening 40 in plural numbers, wherein the high speed functional test and the DC test are respectively carried out for a plurality of DUTs 9.

The driver.comparator circuit 4, etc. constituting the conventional test head are respectively mounted on both surfaces of the pin card 12, thereby reducing the distance between the driver.comparator circuit 4, etc. and the DUT 9.

That is, when the elements such as the driver.comparator circuit 4, etc. are mounted on the inner side 12A alone or the outer side 12B alone of the pin card 12, the distance between the driver.comparator circuit 4, etc. and the DUT 9 is liable to increase. Further, if the elements are mounted on one surface alone of the pin card 12, the mounting space is restricted so that all the elements from the driver.comparator circuit 4 to the terminating resistor 5 (see FIG. 2(A) and FIG. 2(B)) cannot be mounted on the pin card 12.

Because of the mounting of the elements on both surfaces of the pin card 12, the measuring line extending from the driver.comparator circuit 4 mounted on the inner side 12A of the pin card 12 to the terminating resistor 5 mounted on the outer side 12B of the pin card 12 by way of the DUT 9 is not connected by the conductive pattern alone but connected by way of the through hole 13 (see FIG. 2(C)).

As a result, since there occurs an impedance mismatching between the characteristic impedance $Z_O$ and the resistance value $R_E$, when the terminating resistor intermittent relay 6 is turned on while the DC measuring circuit intermittent relay 7 is turned off (see FIG. 2(C)) so as to carry out a high speed functional test of the DUT 9, if the high frequency test pattern signal outputted from the driver 4A constituting the driver.comparator circuit 4 is inputted to the DUT 9, the high frequency test pattern signal is reflected, thereby deteriorating measuring accuracy.

SUMMARY OF THE INVENTION

It is an object of the invention to provide a test head of an IC test device capable of eliminating reflection of a high frequency test pattern signal by relaying a measuring line extending from a driver.comparator circuit to a terminating resistor by way of a DUT without interposing a through hole thereon, thereby enhancing measuring accuracy thereof To achieve the above object, a test head of an IC test device comprises a driver.comparator circuit 4 connected to a DUT 9, a terminating resistor 5 and a DC measuring circuit intermittent relay 7 connected to the DUT 9 by way of a terminating resistor intermittent relay 6, wherein the test head further comprises a first pin card 31 having an IC circuit 10 mounted thereon for mounting thereon the driver.comparator circuit 4 and the DUT 9, a second pin card 32 mounting thereon the terminating resistor intermittent relay 6, the terminating resistor 5 and the DC measuring circuit intermittent relay 7, a DUT board 15 to which the first pin card 31 and the second pin card 32 are secured, and wherein a measuring line extending from the driver.comparator circuit 4 mounted on the first pin card 31 to the terminating resistor 5 mounted on the second pin card 32 by way of the DUT 9 is relayed by a conductive pattern 18 provided on the DUT board 15.

According to the present invention, when the elements such as the driver.comparator circuit 4, etc. are mounted on one surface alone of the pin card 31 or the second pin card 32, the measuring line extending from the driver.comparator circuit 4 to the terminating resistor 5 by way of the DUT 9 mounted on the IC circuit 10 can be relayed by the conductive pattern 18 provided on the DUT board 15 so that the through hole is not interposed or defined in the midway of the measuring line. As a result, even if the high speed functional test of the DUT 9 is carried out, the impedance matching is maintained and the reflection of the high frequency pattern signal is eliminated, thereby enhancing measuring accuracy.

BRIEF DESCRIPTION OF THE DRAWINGS

FIGS. 2(A)–2(C) show a conventional test head of an IC test device; and

PREFERRED EMBODIMENT OF THE INVENTION

Figure 1:
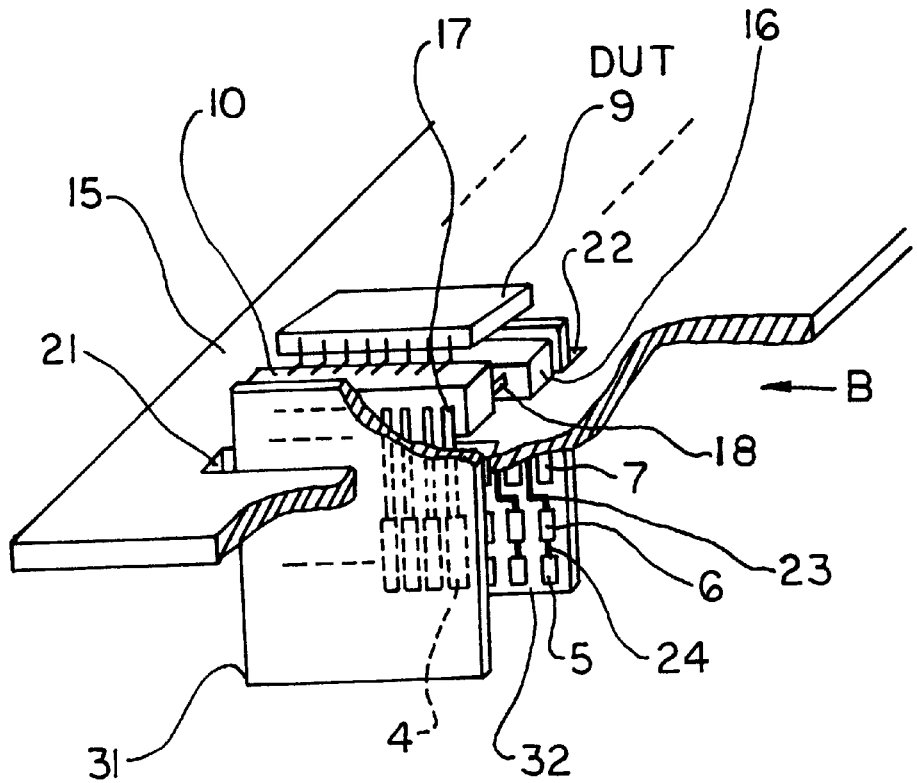
FIGS. 1(A)–1(C) show a test head of an IC test device according to a preferred embodiment of the invention.
Figure 1:
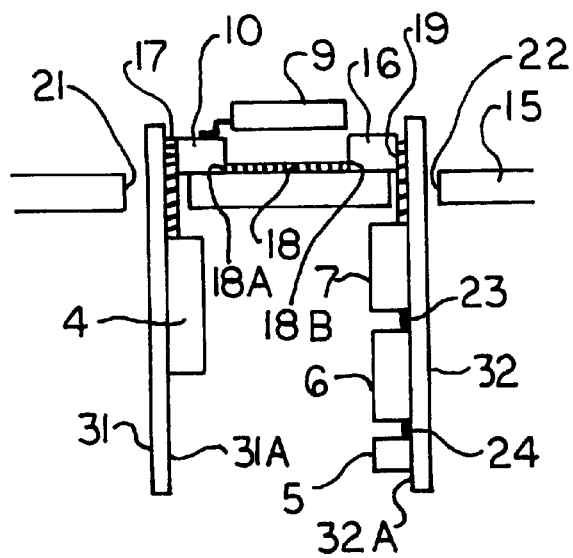
Figure 1:
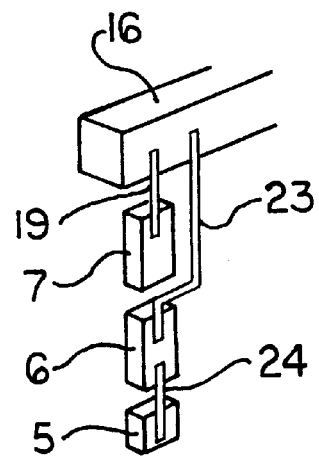

A test head of an IC test device according to a preferred embodiment of the invention will be now described with reference to FIG. 1.

A plurality of first openings 21 and second openings 22 are respectively defined in a DUT board 15, and a first pin card 31 and a second pin card 32 respectively penetrate each of the first openings 21 and second openings 22 so that the first pin card 31 and the second pin card 32 are respectively and perpendicularly secured to the DUT board 15.

Figure 3:
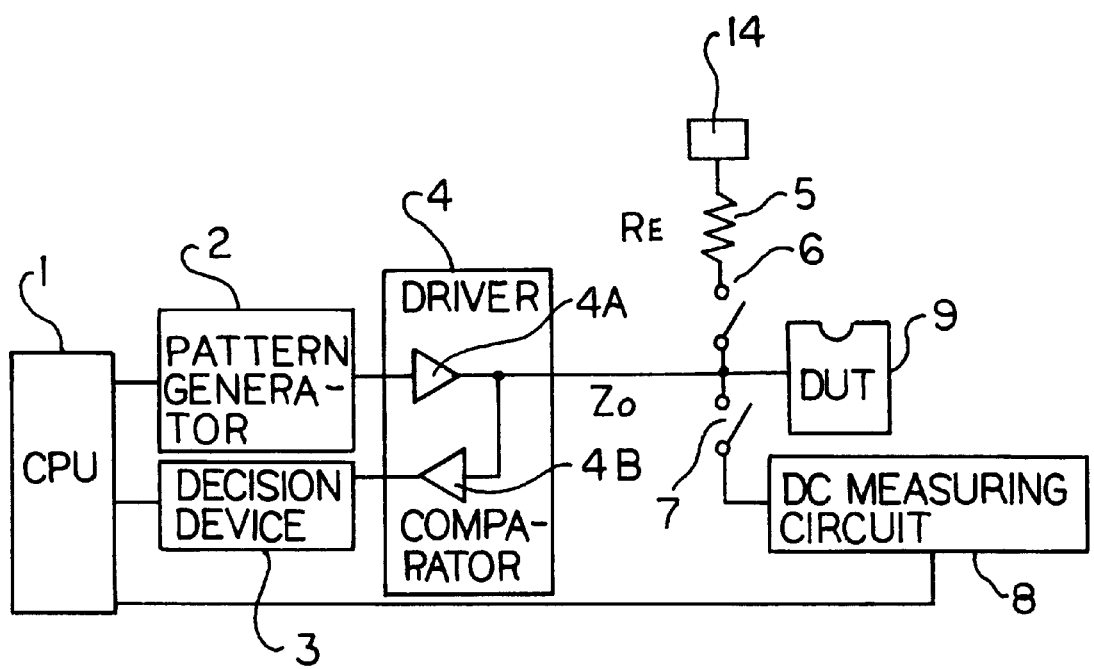
FIG. 3 shows a general arrangement of an IC test device.

As a result, a plurality of DUTs 9 which are mounted on the IC circuit 10, described later, are subjected to a high speed functional test and a DC test set forth above (see FIG. 3). The first pin card 31 has a mounting surface 31A at the inner side thereof (see FIG. 1(B)), and the IC circuit 10 is mounted on the mounting surface 31A at the same position as the DUT board 15, and the driver.comparator circuit 4 is mounted on the mounting surface 31A under the DUT board 15.

The driver.comparator circuit 4 and IC circuit 10 are respectively connected to each other by a conductive pattern 17 provided on the first pin card 31.

The driver.comparator circuit 4 is mounted on the first pin card 31 by the number proportional to the number of pins of the DUT 9, wherein the number of pins of the DUT 9 is 8, and the number of driver.comparator circuit 4 is also 8.

Meanwhile, the second pin card 32 has a mounting surface 32A at the inner side thereof (FIG. 1(B)), and the terminating resistor intermittent relay 6, the terminating resistor 5 and the DC measuring circuit intermittent relay 7 are respectively mounted on the mounting surface 32A under the DUT board 15.

The reason why the mounting surface 31A of the first pin card 31 opposes the mounting surface 32A of the second pin card 32 is to reduce the length of the conductive pattern 18, described later, provided on the DUT board 15 as much as possible.

The terminating resistor intermittent relay 6, the terminating resistor 5 and the DC measuring circuit intermittent relay 7 are respectively mounted on the second pin card 32 by the number proportional to the number of pins of the DUT 9, wherein the number of pins of the DUT 9 is 8 in the preferred embodiment and the numbers of the terminating resistor intermittent relay 6, the terminating resistor 5 and the DC measuring circuit intermittent relay 7 are respectively 8.

As shown in FIG. 1(C), the terminating resistor intermittent relay 6 and the terminating resistor 5 are connected to each other by a conductive pattern 24 provided on the second pin card 32, while an end of a conductive pattern 23 provided on the second pin card 32 is connected to the terminating resistor intermittent relay 6, and further an end of a conductive pattern 19 provided on the second pin card 32 is connected to the DC measuring circuit intermittent relay 7.

The conductive patterns 23 and 19 respectively provided on the second pin card 32 extend upward as shown in FIG. 1(C) to penetrate the second opening 22 of the DUT board 15 (see FIG. 1(B)) while other ends of the conductive patterns 23 and 19 are respectively connected to the conductor connecting portion 16 provided in the vicinity of the second opening 22.

Another end 18B of the conductive pattern 18 provided on the DUT board 15 is connected to the conductor connecting portion 16 (FIG. 1(B)) while one end 18A of the conductive pattern 18 is connected to the aforementioned IC circuit 10 as set forth above.

With the construction set forth above, the measuring line extending form the driver.comparator circuit 4 mounted on the first pin card 31 to the terminating resistor 5 mounted on the second pin card 32 by way of the DUT 9 is relayed by the conductive pattern 18 provided on the DUT board 15.

The conductor connecting portion 16 is formed of, e.g., a connector, and it is provided to facilitate the connection between the conductive pattern 18 which is disposed perpendicularly thereto and the conductive patterns 23 and 19. That is, the first pin card 31 and the second pin card. 32 are respectively secured perpendicularly to the DUT board 15, wherein the first pin card 31 is electrically connected to the DUT board 15 by way of the IC circuit 10 and the second pin card 32 is electrically connected to the DUT board 15 by way of the conductor connecting portion 16.

The operation of the test head of an IC test device of the invention having the aforementioned construction will be now described hereunder.

First of all, the terminating resistor intermittent relay 6 is turned on to terminate at the terminating resistor 5 having the resistance value $R_E$ which is the same as the characteristic impedance $Z_O$ of the signal line extending from the driver.comparator circuit 4 to the DUT 9, while the DC measuring circuit intermittent relay 7 is turned off to be disconnected from the DC measuring circuit 8.

In this state, the high frequency test pattern signal is supplied to the DUT 9 which is mounted on the IC circuit 10.

In this case, the measuring line extending from the driver.comparator circuit 4 mounted on the first pin card 31 to the terminating resistor 5 mounted on the second pin card 32 by way of the DUT 9 is relayed by the conductive pattern 18 provided on the DUT board 15 while no through hole is interposed or defined in the measuring line.

Accordingly, since the impedance matching is performed on the measuring line, no reflection of the high frequency test pattern signal occurs, so that a higher speed functional test of the DUT 9 can be carried out.

According to the present invention, since the test head of an IC test device is structured in that the measuring line extending from the driver.comparator circuit mounted on the first pin card to the terminating resistor mounted on the second pin card by way of the DUT is relayed by the conductive pattern provided on the DUT board so that the measuring line can be relayed without imposing the through hole. As a result, the reflection of the high frequency test pattern signal is eliminated, thereby enhancing measuring accuracy.

What is claimed is:

1. A test head of an IC test device comprising a driver-comparator circuit connected to a DUT, a terminating resistor connected to the DUT by way of a terminating resistor intermittent relay, and a DC measuring circuit intermittent relay connected to the DUT, said test head further comprising a first pin card having an IC circuit and the driver-comparator circuit mounted thereon, said IC circuit connecting the driver-comparator circuit and the DUT;

a second pin card mounting thereon the terminating resistor intermittent relay, the terminating resistor and the DC measuring circuit intermittent relay;

a DUT board to which the first pin card and the second pin card are secured; and wherein a measuring line extending from the drive-comparator circuit mounted on the first pin card to the terminating resistor mounted on the second pin card by way of the DUT is relayed by a conductive pattern provided on the DUT board.

2. The test head of an IC test device according to claim 1, wherein the first pin card and the second pin card are respectively perpendicularly secured to the DUT board, and a mounting surface of the first pin card and another mounting surface of the second pin card oppose each other, and wherein one end of the conductive pattern is connected to the IC circuit which is mounted on the first pin card at the same position as the DUT board while another end of the conductive pattern is connected to the terminating resistor intermittent relay, the terminating resistor and the DC measuring circuit intermittent relay which are respectively mounted under the DUT board by way of a conductor connecting portion provided on the DUT board.

3. A test head of an IC test device comprising:

a test board for receiving a device-under-test, said test board including a test board conductive pattern on one surface thereof;

a first pin card mounted to said test board and including an IC circuit and a driver-comparator circuit connected by a first pin card conductive pattern, an inner surface of said first pin card supporting said IC circuit, said first pin card conductive pattern and said driver-comparator circuit; and a second pin card mounted to said test board and including a terminating resistor intermittent relay connected to a terminating resistor by a terminating resistor conductive pattern, a resistor intermittent relay conductive pattern connecting said terminating resistor intermittent relay to a conductor connecting portion, and a DC measuring circuit intermittent relay connected to said conductor connecting portion by a DC measuring circuit intermittent relay connective pattern, an inner surface of said second pin card supporting said terminating resistor intermittent relay, said terminating resistor, DC measuring circuit intermittent relay, said conductor connecting portion, said terminating resistor conductive pattern, and said resistor intermittent relay conductive pattern, and said DC measuring circuit intermittent relay conductive pattern;

whereby, said IC circuit connects to an end of said test board conductive pattern and said conductor connecting portion connects to an opposing end of said test board conductive pattern.

4. The test head of an IC test device according to claim 3, wherein said inner surface of said first pin card faces said inner surface of said second pin card.

5. The test head of an IC test device according to claim 3, wherein said driver-comparator circuit comprises one of a plurality of driver-comparator circuits.

6. The test head of an IC test device according to claim 3, wherein a measuring line extends from said driver-comparator circuit on said first pin card, via said first pin card conductive pattern, said IC circuit, said device under test, said test board conductive pattern, said conductor connecting portion, said terminating resistor intermittent relay conductive pattern, said terminating resistor intermittent relay, and said terminating resistor conductive pattern to said terminating resistor on said second pin card.

* * * * *